US006703853B1

(12) United States Patent
Wee et al.

(10) Patent No.: US 6,703,853 B1
(45) Date of Patent: Mar. 9, 2004

(54) TEST CONTACT MECHANISM

(75) Inventors: Boon Hee Wee, Singapore (SG); Thean Loy Yap, Singapore (SG); Seok Hiong Tan, Singapore (SG)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/811,501

(22) Filed: Mar. 19, 2001

(51) Int. Cl.$^7$ .............................................. G01R 31/02
(52) U.S. Cl. ...................... 324/755; 324/756; 324/65; 324/158.1
(58) Field of Search ................... 324/755, 761, 324/765, 744, 756, 158.1; 439/66–70

(56) References Cited

U.S. PATENT DOCUMENTS

| | | | |
|---|---|---|---|
| 4,538,104 A | * 8/1985 | Douglas et al. | 324/754 |
| 4,783,719 A | * 11/1988 | Jamison et al. | 174/52.4 |
| 4,842,526 A | * 6/1989 | Stukalin et al. | 439/42 |
| 5,367,253 A | 11/1994 | Wood et al. | |
| 5,408,190 A | 4/1995 | Wood et al. | |
| 5,495,179 A | 2/1996 | Wood et al. | |
| 5,598,096 A | * 1/1997 | Pham et al. | 324/158.1 |
| 5,761,036 A | 6/1998 | Hopfer et al. | |
| 5,815,000 A | 9/1998 | Farnworth et al. | |
| 5,949,242 A | 9/1999 | Wood et al. | |
| 6,099,597 A | 8/2000 | Yap et al. | |
| 6,108,212 A | 8/2000 | Lach et al. | 361/768 |
| 6,118,180 A | 9/2000 | Loo et al. | 257/737 |
| 6,130,546 A | * 10/2000 | Azizi | 324/754 |

FOREIGN PATENT DOCUMENTS

WO 0033360 6/2000

OTHER PUBLICATIONS

International Search Report dated Aug. 6, 2002 in PCT Patent Application No. PCT/US01/45699 filed Nov. 1, 2001.

* cited by examiner

*Primary Examiner*—Kamand Cuneo
*Assistant Examiner*—Tung X. Nguyen
(74) *Attorney, Agent, or Firm*—Amin & Turocy, LLP

(57) ABSTRACT

The present invention provides test contact systems and associated integrated circuit device testing systems, and integrated circuit device testing methods that reduce the number of integrated circuit devices that are lost through handler mishap. The invention provides a test contact system in which a contacting force, or a substantial portion thereof, is exert against the substrate of a device under test, rather than exerting the entire force against the die. The invention also provides a system for adjusting the distribution of the contacting force between the substrate and the die. This mechanism allow the force against the die to be kept within a range that provides good thermal contact between the die and the test contact mechanism without damaging the die. The balance of the contacting force can be transmitted to the substrate of the device under test through a resilient member, thereby further reducing the risk of damage to the device under test. The invention further provides a vacuum seal comprising a foam type material to which devices under test do not stick, which substantially eliminates handler jambs resulting from devices under test sticking to the vacuum seal. The test contact systems of the invention, and associated testing systems and methods, significantly reduce the number of integrated circuit devices damaged during testing.

15 Claims, 4 Drawing Sheets

TEST CONTACT MECHANISM

TECHNICAL FIELD

The present invention relates to semiconductor testing and testing devices. In particular, the present invention relates to a system for establishing contact between a device under test and a test socket.

BACKGROUND OF THE INVENTION

During and after manufacture, integrated circuit devices are subject to exhaustive testing. After an integrated circuit device has been packaged, its contacts are coupled to the channels of an integrated circuit device tester. The tester applies a series of excitations to the device and analyzes the device's responses. On the basis of the test results, the device can be graded and sorted.

Testing is desirably carried out rapidly, accurately, and in high volume. For these purposes, automated testing equipment has been developed. A typical testing system includes a device tester and a device handler. The device handler has a test contact system that picks up a device under test, using suction applied through a silicone vacuum seal, and places the device under test into a socket of the device tester. The test contact system applies a force against the device under test to establish and maintain electrical contact between the device under test and the test socket.

Where the device under test includes a die mounted on a substrate, the test contact system typically applies the contacting force against the die, which is at the center of the substrate. Particularly where the die is un-encased, as is often the case when the device under test is of the flip chip type, the die or the substrate sometimes cracks, resulting in a loss of the device under test. Devices under test can also be lost when a device under test sticks to the vacuum seal resulting in a handler jam.

There is an unsatisfied need for a device testing system that reduces the number of devices lost through handler mishaps.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention provides test contact systems and associated integrated circuit device testing systems, and integrated circuit device testing methods that reduce the number of integrated circuit devices that are lost through handler mishap. The invention provides a test contact system in which a contacting force, or a substantial portion thereof, is exert against the substrate of a device under test, rather than exerting the entire force against the die. The invention also provides a system for adjusting the distribution of the contacting force between the substrate and the die. This mechanism allow the force against the die to be kept within a range that provides good thermal contact between the die and the test contact mechanism without damaging the die. The balance of the contacting force can be transmitted to the substrate of the device under test through a resilient member, thereby further reducing the risk of damage to the device under test. The invention further provides a vacuum seal comprising a foam type material to which devices under test do not stick, which substantially eliminates handler jambs resulting from devices under test sticking to the vacuum seal. The test contact systems of the invention, and associated testing systems and methods, significantly reduce the number of integrated circuit devices damaged during testing.

One aspect of the invention provides a test contact system for exerting a contacting force against an integrated circuit device that comprises an un-encased die attached to a substrate, comprising a body and a contact plate supported by the body, wherein the contact plate exerts at least a substantial portion of the contacting force against the substrate of the integrated circuit device.

Another aspect of the invention provides a test contact system comprising a body, a resilient member, and a contact plate, wherein the body exerts a repelling force against the contact plate through the resilient member.

A further aspect of the invention provides a test contact system comprising a body and a vacuum seal attached to the body for holding a device under test to the body, wherein the vacuum seal comprises a foam type material.

A further aspect of the invention provides a test contact system comprising means for exerting a contacting force against an integrated circuit device, wherein the integrated circuit device comprises an un-encased die attached to a substrate and at least a substantial portion of the contacting force is exerted against the substrate of the integrated circuit device.

A further aspect of the invention provides a method of testing an integrated circuit device comprising , while testing the integrated circuit device, exerting a contacting force to hold the device under test in contact with a socket of a device tester, wherein at least a substantial portion of the contacting force is exerted against a substrate of the device under test.

The invention extends to features hereinafter fully described and features particularly pointed out in the claims. The following detailed description and the annexed drawings set forth in detail certain illustrative examples of the invention. These examples are indicative of but a few of the various ways in which the principles of the invention may be employed. Other ways in which the principles of the invention may be employed and other objects, advantages and novel features of the invention will be apparent from the detailed description of the invention when consider in conjunction with the drawings.

DETAILED DESCRIPTION OF THE INVENTION

Figure 1A:
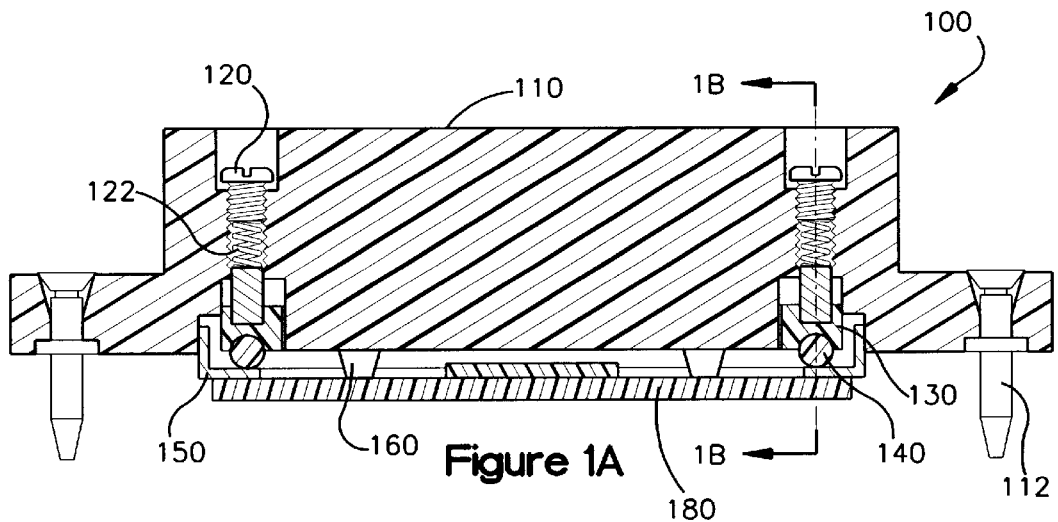
FIG. 1a is a cross-sectional view schematic illustration of a test contact system according to one aspect of the present invention.
Figure 1B:
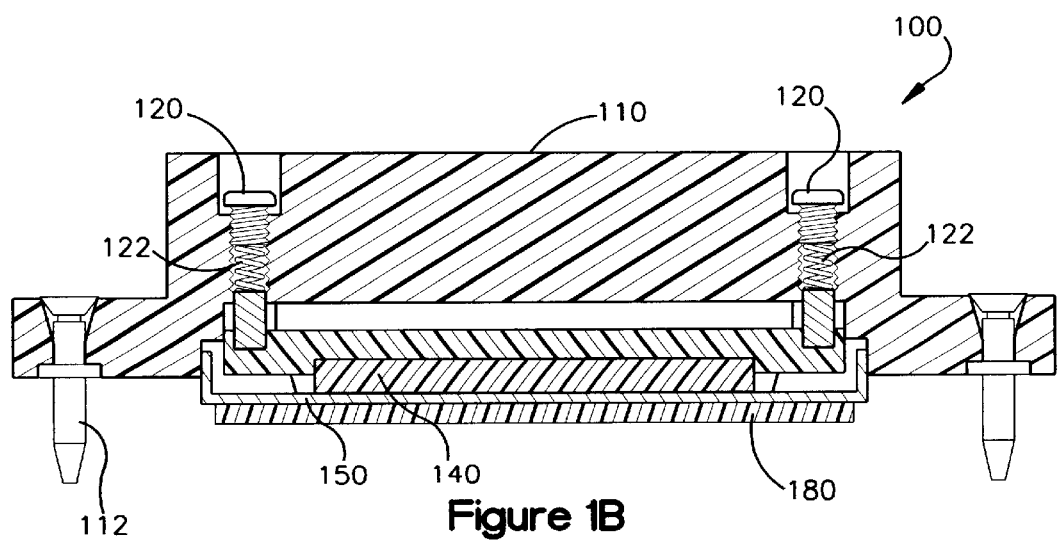
FIG. 1b is a cross-section al vie w schematic illustration of the test contact system of FIG. 1a taken along the line 1B.

FIGS. 1a and 1b schematically illustrate a test contact system 100 exemplifying several aspects of the present invention. Test contact system 100 is part of a device handler that is part of an integrated circuit device testing system. Test contact system 100 includes body 110, tension adjustment screws 120, tension springs 122, primary contact plate 130, resilient members 140, secondary contact plate 150, and vacuum seals 160.

In operation of the integrated circuit device testing system, vacuum seals 160 of test contact system 100 are placed in contact with device under test 180 and a vacuum is applied to hold device under test 180 to test contact system 100, which then carries device under test 180 to a test socket of a device tester. When test contact system 100 is in position over the socket, the device handler exerts a contacting force sufficient to establish reliable electrical contact between device under test 180 and the test socket. Part of the contacting force is exerted through body 110 against the die of device under test 180. This force, which is generally from about 10 ft-lb/in$^2$ to about 30 ft-lb/in$^2$, is sufficient to establish good thermal contact between the die and body 110 without risking damage to the device under test. The balance of the contacting force is exerted against the substrate of the device under test through secondary contact plate 150.

The setting of tension adjustment screws 120 determines the distribution of the force between the die and the substrate. Tension adjustment screws 120 adjust the tension on springs 120. The portion of the contacting force that is not exerted against the die is exerted through springs 122 against primary contact plate 130. The force from primary contact plate 130 is transmitted through resilient members 140, which provide a cushioning effect. The force from resilient members 140 is transmitted to secondary contact plate 150 and from secondary contact plate 150 against the substrate of device under test 180.

After testing, test contact system 100 carries the device under test away from the socket and the vacuum is released, whereupon the device under test separates from vacuum seals 160. Vacuum seals 160 are constructed using a foam-type material, which facilitates the release of device under test 180.

Test contact system 100 has several novel features described more fully below. These features include a contact plate adapted to apply a contacting force against the substrate of the device under test, a force distribution system for adjustably distributing the total contacting force between the substrate and a die of the device under test, an elastic member to cushion the force applied against the substrate, and vacuum seals with foam-type material construction.

The contacting force is exerted by the device handler through body 110 of test contact system 100. Body 110 can be constructed of metal, re-enforced plastic, or any other suitable material. Body 110 generally provides a manifold for the vacuum exerted through vacuum seals 160. Body 110 can also provides for controlling the temperature of the device under test, for example, with ducts for directing heated air to the test site. Temperature stability can also be advanced by body 110 providing a large thermal mass in proximity to the device under test to dissipate heat generated during testing. For this purpose, body 110 can be configured to contact the die of the device under test while secondary contact plate 150 acts against the substrate of the device under test. Optionally, body 110 can be provided with a second contacting member for contacting the die of the device under test. A contacting force can thus be exerted on the die of the device under test while a contacting force is also being exerted against the substrate of the device under test.

The total contacting force exerted against body 110, and through body 110 to hold a device under test against a test socket, is fixed by the device handler in an amount determined by the testing system. But when part of the contacting force is exerted against the die, the distribution of the contacting force between the substrate and the die can be varied according to the settings of tension screws 120.

Figure 2:
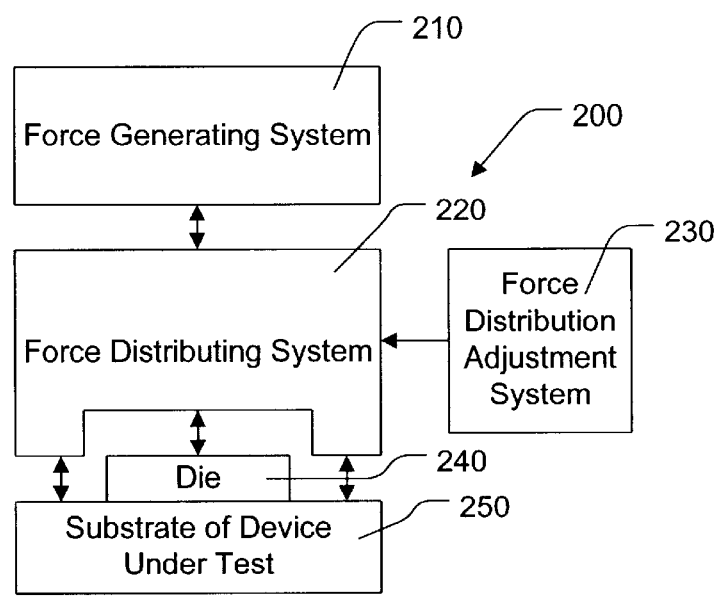
FIG. 2 is a high level schematic illustration of a test contact system according to another aspect of the present invention.

Tension adjustment screws 120 are supported by body 110 and act against tension springs 122. This tension adjustment system is a specific example of a broader concept, illustrated in FIG. 2. FIG. 2 is a high level schematic illustration of test contact system 200 that provides a system for distributing the force from force generating system 210 between die 240 and substrate 250 of the device under test. Test contact system 200 includes force distributing system 220 and force distribution adjustment system 230.

Force generating system 210 is a portion of the device handler, generally comprising a plunger, that generates a contacting force. The total contacting force, which is generally determined by the requirements of a device contactor, is exerted by force generating system 210.

Force distributing system 220 includes a mechanism for exerting a force selectively against either die 240 or substrate 250 of the device under test. This selectively exerted force is less than or equal to the force exerted by force generating system 210. Where the selectively exerted force is less, the balance of the force is passively applied against a portion of the device under test other than that to which the selectively exerted force is applied.

In one aspect of the invention, the selectively exerted force is exerted against die 240. In another aspect of the invention, the force is exerted against substrate 250. Suitable mechanism for exerting this force include, for example, springs, hydraulics, or piezoelectric elements. Force adjustment system 230 is designed with reference to the mechanism used by force distribution system 220 to exert the force and can include, for example, screws acting against springs, a pump and pressure regulator for hydraulics, or a voltage regulator for piezoelectric elements.

The force distribution can be adjusted periodically to ensure the force on the die remains at a level sufficient to establish satisfactory thermal contact between the die of the device under test and the force distributing system, which acts as a heat sink for the die. The force on the die is generally from about 10 ft-lb/in$^2$ to about 30 ft-lb/in$^2$.

In test contact system 100, a force against the substrate is exerted through resilient member 140. Primary contacting plate 130 is provided to facilitate transfer of the contacting force from tension springs 122 to resilient member 140. Springs 122 act against primary contacting plate 130. Resilient member 140, which is set within contacting plate 130, extends to one side of contacting plate 130 and transfers the force to secondary contacting plate 150.

Figure 3:
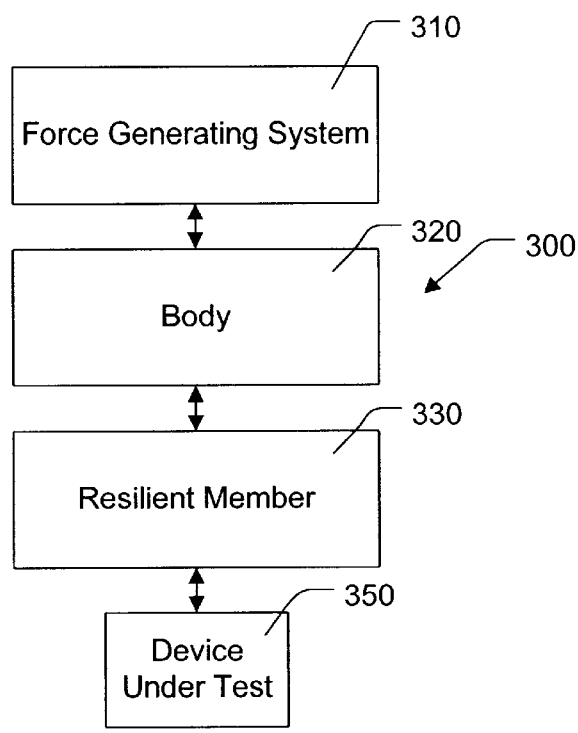
FIG. 3 is a high level schematic illustration of a test contact system according to a further aspect of the present invention.

Primary contacting plate 130, resilient member 140, and secondary contacting plate 150 are a specific example of a broader concept, illustrated in FIG. 3. FIG. 3 is a high level schematic illustration of test contact system 300. Test contact system 300 includes body 320 and resilient member 330. The force from force generating system 310 is transferred through body 320 and resilient member 330 to device under test 350, whereby the force is cushioned. The construction of resilient member 330 includes a material that serves to cushion the contacting force as it is being applied to the device under test. For example, resilient member 140 can include, for example, fluorocarbon rubber, silicone, a butadiene/acrylonitrile copolymer, or another material commonly employed to make O-rings. In fact, a suitable elastic member can be constructed from O-rings.

Figure 4:
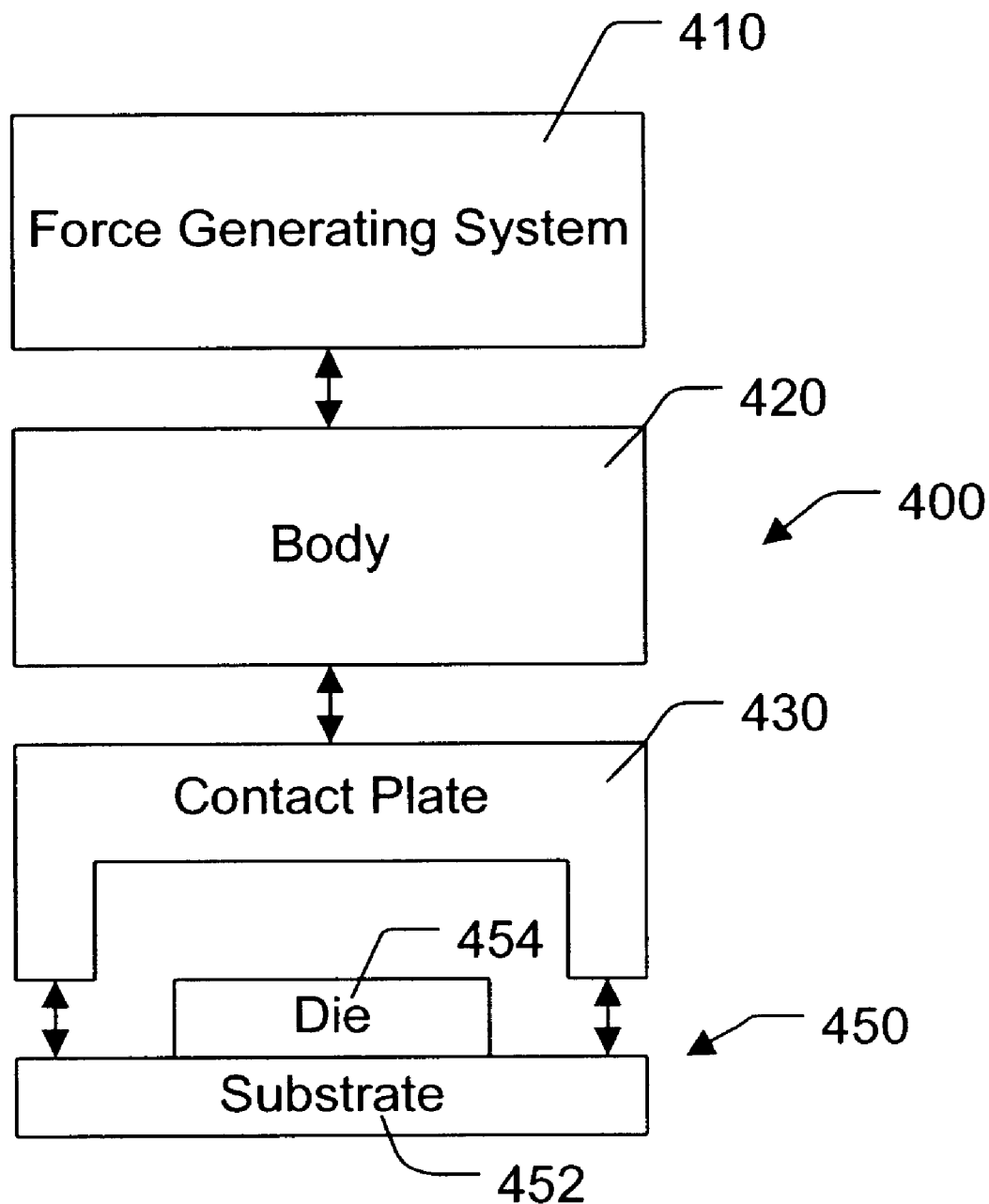
FIG. 4 is a high level schematic illustration of a test contact system according to a further aspect of the present invention.

In test contact system 100, the force from resilient member 140 is exerted through secondary contacting plate 150, which applies the force against the substrate of a device under test. Applying the contacting force against the substrate of the device under test is another broad concept, which is illustrated in FIG. 4. FIG. 4 is a high level schematic illustration of test contact system 400. Test contact system 400 includes body 420 and contacting plate 430. A contacting force from force generating system 410 is transferred through body 420 and contact plate 430. Contacting plate 430 is configured to transmit the contacting force against substrate 454 of device under test 450.

Contacting plate 430 is configured with reference to device under test 450, which includes substrate 452 and die 454. Generally, die 454 is at the center of device under test 450 and contacting plate 430 is configured to contact the device under test along its periphery. Thus, contacting plate 430 can, for example, have a shape that is generally that of a hollow rectangle or circle.

While the device under test can be any integrated circuit chip, whether wire bonded to a lead frame or flip-chip mounted on a substrate, the invention is particularly well suited for use with flip-chip mounted dies. In the flip-chip configuration, the die is usually not encased in a thermoset plastic, as is often the case with dies wire-bonded to lead frames. The flip-chips are often very small, about 1 cm wide or less, for example. The small size and exposed die make these flip-chips more fragile in comparison to device packages that are encapsulated in thermoset plastic. The invention in its several aspects provides delicate handling of the devices.

Part of the handling operation is to pick up the devices and move them. Test contact system 100 provides a vacuum, applied through vacuum seals 160 for this purpose. Vacuum seals 160 are constructed using a foam-type material, such as, for example a polyethylene, polyurethane, or epoxy foam. The material is selected to be one that is less prone than silicone to becoming sticky during high temperature testing. Non-sticking vacuum seals reduce the number of handler jams that result from devices under test failing to disengage from the test contact system when suction is discontinued.

Figure 5:
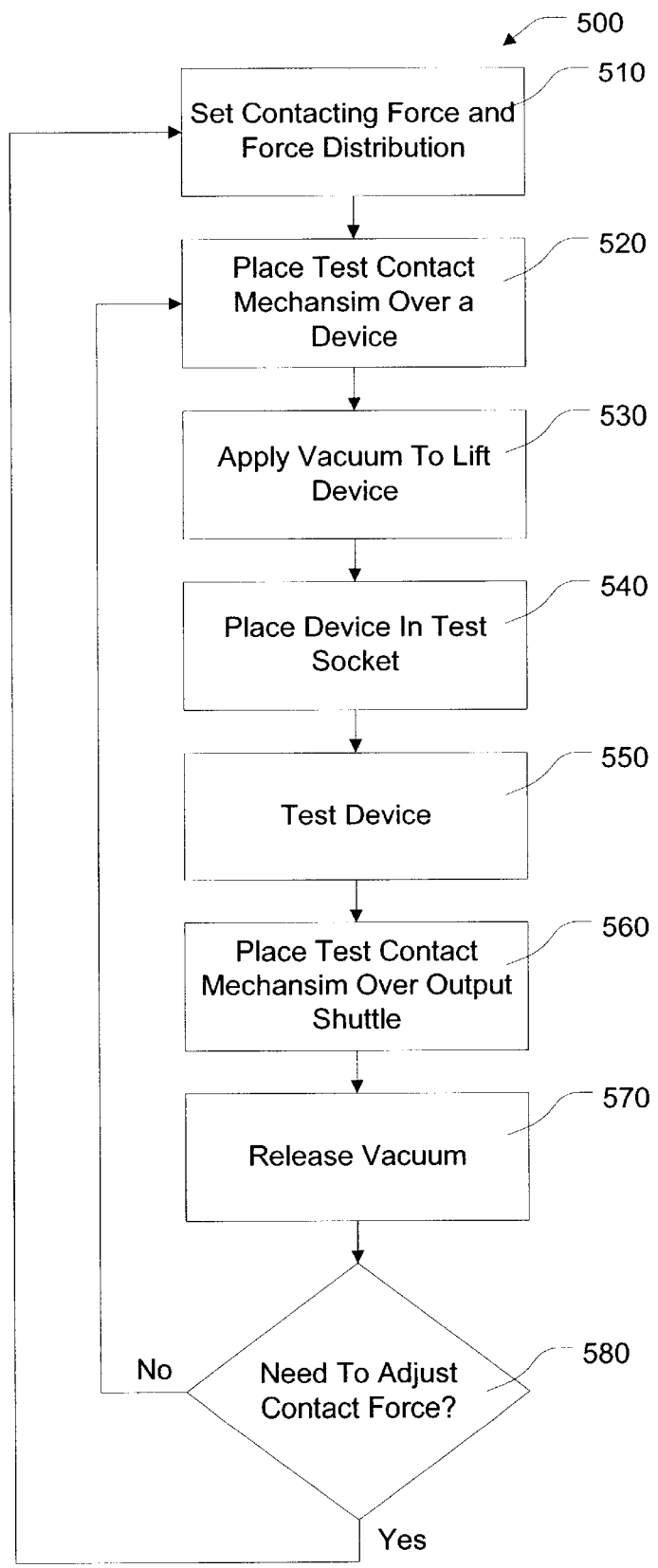
FIG. 5 is a flow diagram of a process according to a further aspect of the present invention.

FIG. 5 is a flow diagram of a process 500 provided by a further aspect of the present invention. The contacting force and force distribution are initially set in step 510. The contacting force is generally selected to provide a force close to the minimum sufficient to establish good electrical communication between the devices under test and the test socket. The force distribution is adjusted to provide a force against the dies of the devices that is near the minimum of that required to establish good thermal contact between the dies and the test contact system.

In step 520, the test contact system is placed over a device to be tested such that vacuum seals on the test contact system make contact with the upper surface of the device. Typically, at this stage the device is in the input shuttle of an automated device handler of which the test contact system is one component. A vacuum is applied in step 530, whereby the device is held to the test contact system and can be carried over to the test socket. In step 540, the test contact system places the device into the test socket. After the device has been tested in step 550, the device is taken to an output shuttle in step 560. There can be a plurality of output shuttles and the output shuttle selected can depend on the test results, whereby the devices are sorted. At the output shuttle, in step 570, the vacuum is released and the device separates from the test contact system.

At this point, in step 580, a decision can be made. Either the test contact system returns immediately to pick up another device for testing or the contacting force and/or force distribution are adjusted. The need to adjust the contacting force can be determined in several ways. For example, a need to adjust the contacting force can be determined by test results that are indicative of inadequate contacting between the device under test and the test socket. In another example, an operator, or automatic inspection system, can signal the need to adjust the contacting force distribution based on an observation that a device under test has been damaged during testing. The decision can be made automatically, by a controller, or by an operator.

What has been described above is the present invention and several of its specific aspects. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Furthermore, where the term "includes" has been used it is intended to be inclusive in a manner similar to the term "comprising."

What is claimed is:

1. A test contact system for exerting a contacting force against an integrated circuit device that comprises an un-encased die attached to a substrate, comprising:

a body; and a contact plate supported by the body;

wherein the contact plate exerts at least a substantial portion of the contacting force against the substrate of the integrated circuit device, and wherein a portion of the contacting force is exerted against the die.

2. The test contact system of claim 1, wherein all of the contacting force is exerted against the substrate.

3. The test contact system of claim 1, wherein the distribution of the contacting force between the substrate and the die is adjustable.

4. The test contact system of claim 3, wherein the portion of the contacting force exerted against the substrate is exerted through springs and the distribution of the contacting force is adjustable through set screws acting against the springs.

5. The test contact system of claim 3, wherein the contacting force exerted by the contact plate against the substrate is transmitted through a resilient member.

6. The test contact system of claim 1, wherein the contacting force exerted by the contact plate against the substrate is transmitted through a resilient member.

7. A test contact system, comprising:

a body; and a vacuum seal attached to the body for picking up, holding, and moving a device under test to the body;

wherein the vacuum seal comprises a foam type material.

8. A test contact system, comprising:

means for exerting a contacting force against an integrated circuit device;

wherein the integrated circuit device comprises an un-encased die attached to a substrate and at least a substantial portion of the contacting force is exerted against the substrate of the integrated circuit device; and means for adjusting a distribution of the contacting force between the substrate and the die.

9. A method of testing an integrated circuit device, comprising:

while testing the integrated circuit device, exerting a contacting force to hold the integrated circuit device in contact with a socket of a device tester;

wherein at least a substantial portion of the contacting force is exerted against a substrate of the integrated circuit device, and wherein a distribution of the contacting force between the substrate of the integrated circuit device and a die of the integrated circuit device is adjustable.

10. The method of claim 9, the portion of the contacting force exerted against the substrate is exerted through a resilient member.

11. The method of claim 9, wherein the integrated circuit device is a flip chip comprising an un-encased die.

12. The method of claim 9, further comprising carrying the integrated circuit device to the socket while holding the integrated circuit device to a handler using a vacuum and a vacuum seal.

13. The method of claim 12, wherein the vacuum seal comprises a foam type material.

14. The method of claim 9, wherein the force is exerted by a test contact system that also serves to dissipate heat from the integrated circuit device during testing.

15. The method of claim 14, wherein the test contact system contacts the die of the integrated circuit device.

\* \* \* \* \*

UNITED STATES PATENT AND TRADEMARK OFFICE
CERTIFICATE OF CORRECTION

PATENT NO. : 6,703,853 B1
DATED : March 9, 2004
INVENTOR(S) : Boon Hee Wee et al.

It is certified that error appears in the above-identified patent and that said Letters Patent is hereby corrected as shown below:

<u>Title page,</u>
Item [57], ABSTRACT,
Line 7, replace "exert" with -- exerted --
Line 11, replace "allow" with -- allows --

<u>Column 1,</u>
Line 58, replace "exert" with -- exerted --
Line 62, replace "allow" with -- allows --

<u>Column 2,</u>
Line 32, replace "comprising ," with -- comprising, --

<u>Column 4,</u>
Line 22, replace "plunger, that" with -- plunger that --
Line 38, replace "mechanism" with -- mechanisms --

<u>Column 6,</u>
Line 19, delete the comma after the word "automatically"

Signed and Sealed this

Twenty-ninth Day of June, 2004

JON W. DUDAS
*Acting Director of the United States Patent and Trademark Office*